(12) United States Patent
Pachner

(10) Patent No.: US 10,235,479 B2
(45) Date of Patent: Mar. 19, 2019

(54) IDENTIFICATION APPROACH FOR INTERNAL COMBUSTION ENGINE MEAN VALUE MODELS

(71) Applicant: GARRETT TRANSPORTATION I INC., Torrance, CA (US)

(72) Inventor: Daniel Pachner, Prague (CZ)

(73) Assignee: Garrett Transportation I Inc., Torrance, CA (US)

(*) Notice: Subject to any disclaimer, the term of this patent is extended or adjusted under 35 U.S.C. 154(b) by 342 days.

(21) Appl. No.: 15/134,688

(22) Filed: Apr. 21, 2016

(65) Prior Publication Data
US 2016/0328500 A1    Nov. 10, 2016

(30) Foreign Application Priority Data

May 6, 2015   (EP) .................................. 15166671

(51) Int. Cl.
*F02D 41/00*    (2006.01)
*G06F 17/11*    (2006.01)
(Continued)

(52) U.S. Cl.
CPC ..... *G06F 17/5009* (2013.01); *F02D 41/0007* (2013.01); *F02D 41/0052* (2013.01); *F02D 41/1401* (2013.01); *G06F 17/11* (2013.01); *F02D 2041/1433* (2013.01); *Y02T 10/144* (2013.01); *Y02T 10/47* (2013.01)

(58) Field of Classification Search
CPC ................ F02D 2041/1433–2041/1437; G06F 17/11–17/13; G06F 17/16; G06F 17/5009; G06F 17/5095
See application file for complete search history.

(56) References Cited

U.S. PATENT DOCUMENTS

| 3,744,461 A | 7/1973 | Davis |
| 4,005,578 A | 2/1977 | McInerney |

(Continued)

FOREIGN PATENT DOCUMENTS

| CN | 102063561 | 5/2011 |
| CN | 102331350 | 1/2012 |

(Continued)

OTHER PUBLICATIONS

Walström et al., "Modelling diesel engines with a variable-gemetry turbocharger and exhaust gas recirculation by optimization of model parameters for capturing non-linear system dynamics" (2011), Proc. IMechE, vol. 225, Part D, pp. 960-986 retrieved from http://journals.sagepub.com/doi/pdf/10.1177/0954407011398177.*

(Continued)

*Primary Examiner* — Brian W Wathen
(74) *Attorney, Agent, or Firm* — Seager, Tufte & Wickhem LLP

(57) ABSTRACT

A system or approach for identifying mean value models with a set of equations and appropriate constraints which define the model validity. A model may be used to design an algorithm for an engine system, collecting sensed data, optimizing control parameters based on the models and data, and providing control of the engine system. These processed may be reiterated for updating control of the engine system.

14 Claims, 5 Drawing Sheets

(51) Int. Cl.
  *G06F 17/50* (2006.01)
  *F02D 41/14* (2006.01)

(56) References Cited

U.S. PATENT DOCUMENTS

| | | |
|---|---|---|
| 4,055,158 A | 10/1977 | Marsee |
| 4,206,606 A | 6/1980 | Yamada |
| 4,252,098 A | 2/1981 | Tomczak et al. |
| 4,359,991 A | 11/1982 | Stumpp et al. |
| 4,383,441 A | 5/1983 | Willis et al. |
| 4,426,982 A | 1/1984 | Lehner et al. |
| 4,438,497 A | 3/1984 | Willis et al. |
| 4,440,140 A | 4/1984 | Kawagoe et al. |
| 4,456,883 A | 6/1984 | Bullis et al. |
| 4,485,794 A | 12/1984 | Kimberley et al. |
| 4,601,270 A | 7/1986 | Kimberley et al. |
| 4,616,308 A | 10/1986 | Morshedi et al. |
| 4,653,449 A | 3/1987 | Kamei et al. |
| 4,671,235 A | 6/1987 | Hosaka |
| 4,677,559 A | 6/1987 | Van Bruck |
| 4,735,181 A | 4/1988 | Kaneko et al. |
| 4,947,334 A | 8/1990 | Massey et al. |
| 4,962,570 A | 10/1990 | Hosaka et al. |
| 5,044,337 A | 9/1991 | Williams |
| 5,076,237 A | 12/1991 | Hartman et al. |
| 5,089,236 A | 2/1992 | Clerc |
| 5,094,213 A | 3/1992 | Dudek et al. |
| 5,095,874 A | 3/1992 | Schnaibel et al. |
| 5,108,716 A | 4/1992 | Nishizawa |
| 5,123,397 A | 6/1992 | Richeson |
| 5,150,289 A | 9/1992 | Badavas |
| 5,186,081 A | 2/1993 | Richardson et al. |
| 5,233,829 A | 8/1993 | Komatsu |
| 5,270,935 A | 12/1993 | Dudek et al. |
| 5,273,019 A | 12/1993 | Matthews et al. |
| 5,282,449 A | 2/1994 | Takahashi et al. |
| 5,293,553 A | 3/1994 | Dudek et al. |
| 5,349,816 A | 9/1994 | Sanbayashi et al. |
| 5,365,734 A | 11/1994 | Takeshima |
| 5,394,322 A | 2/1995 | Hansen |
| 5,394,331 A | 2/1995 | Dudek et al. |
| 5,398,502 A | 3/1995 | Watanabe |
| 5,408,406 A | 4/1995 | Mathur et al. |
| 5,431,139 A | 7/1995 | Gruffer et al. |
| 5,452,576 A | 9/1995 | Hamburg et al. |
| 5,477,840 A | 12/1995 | Neumann |
| 5,560,208 A | 10/1996 | Halimi et al. |
| 5,570,574 A | 11/1996 | Yamashita et al. |
| 5,598,825 A | 2/1997 | Neumann |
| 5,609,139 A | 3/1997 | Ueda et al. |
| 5,611,198 A | 3/1997 | Lane et al. |
| 5,682,317 A | 10/1997 | Keeler et al. |
| 5,690,086 A | 11/1997 | Kawano et al. |
| 5,692,478 A | 12/1997 | Nogi et al. |
| 5,697,339 A | 12/1997 | Esposito |
| 5,704,011 A | 12/1997 | Hansen et al. |
| 5,740,033 A | 4/1998 | Wassick et al. |
| 5,746,183 A | 5/1998 | Parke et al. |
| 5,765,533 A | 6/1998 | Nakajima |
| 5,771,867 A | 6/1998 | Amstutz et al. |
| 5,785,030 A | 7/1998 | Paas |
| 5,788,004 A | 8/1998 | Friedmann et al. |
| 5,842,340 A | 12/1998 | Bush et al. |
| 5,846,157 A | 12/1998 | Reinke et al. |
| 5,893,092 A | 4/1999 | Driscoll |
| 5,924,280 A | 7/1999 | Tarabulski |
| 5,942,195 A | 8/1999 | Lecea et al. |
| 5,964,199 A | 10/1999 | Atago et al. |
| 5,970,075 A | 10/1999 | Wasada |
| 5,974,788 A | 11/1999 | Hepburn et al. |
| 5,995,895 A | 11/1999 | Watt et al. |
| 6,029,626 A | 2/2000 | Bruestle |
| 6,035,640 A | 3/2000 | Kolmanovsky et al. |
| 6,048,620 A | 4/2000 | Zhong |
| 6,048,628 A | 4/2000 | Hillmann et al. |
| 6,055,810 A | 5/2000 | Borland et al. |
| 6,056,781 A | 5/2000 | Wassick et al. |
| 6,058,700 A | 5/2000 | Yamashita et al. |
| 6,067,800 A | 5/2000 | Kolmanovsky et al. |
| 6,076,353 A | 6/2000 | Fruedenberg et al. |
| 6,105,365 A | 8/2000 | Deeba et al. |
| 6,122,555 A | 9/2000 | Lu |
| 6,134,883 A | 10/2000 | Kato et al. |
| 6,153,159 A | 11/2000 | Engeler et al. |
| 6,161,528 A | 12/2000 | Akao et al. |
| 6,170,259 B1 | 1/2001 | Boegner et al. |
| 6,171,556 B1 | 1/2001 | Burk et al. |
| 6,178,743 B1 | 1/2001 | Hirota et al. |
| 6,178,749 B1 | 1/2001 | Kolmanovsky et al. |
| 6,208,914 B1 | 3/2001 | Ward et al. |
| 6,216,083 B1 | 4/2001 | Ulyanov et al. |
| 6,233,922 B1 | 5/2001 | Maloney |
| 6,236,956 B1 | 5/2001 | Mantooth et al. |
| 6,237,330 B1 | 5/2001 | Takahashi et al. |
| 6,242,873 B1 | 6/2001 | Drozdz et al. |
| 6,263,672 B1 | 7/2001 | Roby et al. |
| 6,273,060 B1 | 8/2001 | Cullen |
| 6,279,551 B1 | 8/2001 | Iwano et al. |
| 6,312,538 B1 | 11/2001 | Latypov et al. |
| 6,314,724 B1 | 11/2001 | Kakuyama et al. |
| 6,321,538 B2 | 11/2001 | Hasler |
| 6,327,361 B1 | 12/2001 | Harshavardhana et al. |
| 6,338,245 B1 | 1/2002 | Shimoda et al. |
| 6,341,487 B1 | 1/2002 | Takahashi et al. |
| 6,347,619 B1 | 2/2002 | Whiting et al. |
| 6,360,159 B1 | 3/2002 | Miller et al. |
| 6,360,541 B2 | 3/2002 | Waszkiewicz et al. |
| 6,360,732 B1 | 3/2002 | Bailey et al. |
| 6,363,715 B1 | 4/2002 | Bidner et al. |
| 6,363,907 B1 | 4/2002 | Arai et al. |
| 6,379,281 B1 | 4/2002 | Collins et al. |
| 6,389,803 B1 | 5/2002 | Surnilla et al. |
| 6,425,371 B2 | 7/2002 | Majima |
| 6,427,436 B1 | 8/2002 | Allansson et al. |
| 6,431,160 B1 | 8/2002 | Sugiyama et al. |
| 6,445,963 B1 | 9/2002 | Blevins et al. |
| 6,446,430 B1 | 9/2002 | Roth et al. |
| 6,453,308 B1 | 9/2002 | Zhao et al. |
| 6,463,733 B1 | 10/2002 | Asik et al. |
| 6,463,734 B1 | 10/2002 | Tamura et al. |
| 6,466,893 B1 | 10/2002 | Latwesen et al. |
| 6,470,682 B2 | 10/2002 | Gray, Jr. |
| 6,470,862 B2 | 10/2002 | Isobe et al. |
| 6,470,886 B1 | 10/2002 | Jestrabek-Hart |
| 6,481,139 B2 | 11/2002 | Weldle |
| 6,494,038 B2 | 12/2002 | Kobayashi et al. |
| 6,502,391 B1 | 1/2003 | Hirota et al. |
| 6,510,351 B1 | 1/2003 | Blevins et al. |
| 6,512,974 B2 | 1/2003 | Houston et al. |
| 6,513,495 B1 | 2/2003 | Franke et al. |
| 6,532,433 B2 | 3/2003 | Bharadwaj et al. |
| 6,546,329 B2 | 4/2003 | Bellinger |
| 6,550,307 B1 | 4/2003 | Zhang et al. |
| 6,553,754 B2 | 4/2003 | Meyer et al. |
| 6,560,528 B1 | 5/2003 | Gitlin et al. |
| 6,560,960 B2 | 5/2003 | Nishimura et al. |
| 6,571,191 B1 | 5/2003 | York et al. |
| 6,579,206 B2 | 6/2003 | Liu et al. |
| 6,591,605 B2 | 7/2003 | Lewis |
| 6,594,990 B2 | 7/2003 | Kuenstler et al. |
| 6,601,387 B2 | 8/2003 | Zurawski et al. |
| 6,612,293 B2 | 9/2003 | Schweinzer et al. |
| 6,615,584 B2 | 9/2003 | Ostertag |
| 6,625,978 B1 | 9/2003 | Eriksson et al. |
| 6,629,408 B1 | 10/2003 | Murakami et al. |
| 6,637,382 B1 | 10/2003 | Brehob et al. |
| 6,644,017 B2 | 11/2003 | Takahashi et al. |
| 6,647,710 B2 | 11/2003 | Nishiyama et al. |
| 6,647,971 B2 | 11/2003 | Vaughan et al. |
| 6,651,614 B2 | 11/2003 | Flamig-Vetter et al. |
| 6,662,058 B1 | 12/2003 | Sanchez |
| 6,666,198 B2 | 12/2003 | Mitsutani |
| 6,666,410 B2 | 12/2003 | Boelitz et al. |
| 6,671,603 B2 | 12/2003 | Cari et al. |

(56) References Cited

U.S. PATENT DOCUMENTS

| | | |
|---|---|---|
| 6,672,052 B2 | 1/2004 | Taga et al. |
| 6,672,060 B1 | 1/2004 | Buckland et al. |
| 6,679,050 B1 | 1/2004 | Takahashi et al. |
| 6,687,597 B2 | 2/2004 | Sulatisky et al. |
| 6,688,283 B2 | 2/2004 | Jaye |
| 6,694,244 B2 | 2/2004 | Meyer et al. |
| 6,694,724 B2 | 2/2004 | Tanaka et al. |
| 6,705,084 B2 | 3/2004 | Allen et al. |
| 6,718,254 B2 | 4/2004 | Hashimoto et al. |
| 6,718,753 B2 | 4/2004 | Bromberg et al. |
| 6,725,208 B1 | 4/2004 | Hartman et al. |
| 6,736,120 B2 | 5/2004 | Surnilla |
| 6,738,682 B1 | 5/2004 | Pasadyn |
| 6,739,122 B2 | 5/2004 | Kitajima et al. |
| 6,742,330 B2 | 6/2004 | Genderen |
| 6,743,352 B2 | 6/2004 | Ando et al. |
| 6,748,936 B2 | 6/2004 | Kinomura et al. |
| 6,752,131 B2 | 6/2004 | Poola et al. |
| 6,752,135 B2 | 6/2004 | McLaughlin et al. |
| 6,757,579 B1 | 6/2004 | Pasadyn |
| 6,758,037 B2 | 7/2004 | Terada et al. |
| 6,760,631 B1 | 7/2004 | Berkowitz et al. |
| 6,760,657 B2 | 7/2004 | Katoh |
| 6,760,658 B2 | 7/2004 | Yasui et al. |
| 6,770,009 B2 | 8/2004 | Badillo et al. |
| 6,772,585 B2 | 8/2004 | Iihoshi et al. |
| 6,775,623 B2 | 8/2004 | Ali et al. |
| 6,779,344 B2 | 8/2004 | Hartman et al. |
| 6,779,512 B2 | 8/2004 | Mitsutani |
| 6,788,072 B2 | 9/2004 | Nagy et al. |
| 6,789,533 B1 | 9/2004 | Hashimoto et al. |
| 6,792,927 B2 | 9/2004 | Kobayashi |
| 6,804,618 B2 | 10/2004 | Junk |
| 6,814,062 B2 | 11/2004 | Esteghlal et al. |
| 6,817,171 B2 | 11/2004 | Zhu |
| 6,823,667 B2 | 11/2004 | Braun et al. |
| 6,823,675 B2 | 11/2004 | Brunell et al. |
| 6,826,903 B2 | 12/2004 | Yahata et al. |
| 6,827,060 B2 | 12/2004 | Huh |
| 6,827,061 B2 | 12/2004 | Nytomt et al. |
| 6,827,070 B2 | 12/2004 | Fehl et al. |
| 6,834,497 B2 | 12/2004 | Miyoshi et al. |
| 6,839,637 B2 | 1/2005 | Moteki et al. |
| 6,849,030 B2 | 2/2005 | Yamamoto et al. |
| 6,874,467 B2 | 4/2005 | Hunt et al. |
| 6,879,906 B2 | 4/2005 | Makki et al. |
| 6,882,929 B2 | 4/2005 | Liang et al. |
| 6,904,751 B2 | 6/2005 | Makki et al. |
| 6,911,414 B2 | 6/2005 | Kimura et al. |
| 6,915,779 B2 | 7/2005 | Sriprakash |
| 6,920,865 B2 | 7/2005 | Lyon |
| 6,923,902 B2 | 8/2005 | Ando et al. |
| 6,925,372 B2 | 8/2005 | Yasui |
| 6,925,796 B2 | 8/2005 | Nieuwstadt et al. |
| 6,928,362 B2 | 8/2005 | Meaney |
| 6,928,817 B2 | 8/2005 | Ahmad |
| 6,931,840 B2 | 8/2005 | Strayer et al. |
| 6,934,931 B2 | 8/2005 | Plumer et al. |
| 6,941,744 B2 | 9/2005 | Tanaka |
| 6,945,033 B2 | 9/2005 | Sealy et al. |
| 6,948,310 B2 | 9/2005 | Roberts, Jr. et al. |
| 6,953,024 B2 | 10/2005 | Linna et al. |
| 6,965,826 B2 | 11/2005 | Andres et al. |
| 6,968,677 B2 | 11/2005 | Tamura |
| 6,971,258 B2 | 12/2005 | Rhodes et al. |
| 6,973,382 B2 | 12/2005 | Rodriguez et al. |
| 6,978,744 B2 | 12/2005 | Yuasa et al. |
| 6,988,017 B2 | 1/2006 | Pasadyn et al. |
| 6,996,975 B2 | 2/2006 | Radhamohan et al. |
| 7,000,379 B2 | 2/2006 | Makki et al. |
| 7,013,637 B2 | 3/2006 | Yoshida |
| 7,016,779 B2 | 3/2006 | Bowyer |
| 7,028,464 B2 | 4/2006 | Rosel et al. |
| 7,039,475 B2 | 5/2006 | Sayyarrodsari et al. |
| 7,047,938 B2 | 5/2006 | Flynn et al. |
| 7,052,434 B2 | 5/2006 | Makino et al. |
| 7,055,311 B2 | 6/2006 | Beutel et al. |
| 7,059,112 B2 | 6/2006 | Bidner et al. |
| 7,063,080 B2 | 6/2006 | Kitah et al. |
| 7,067,319 B2 | 6/2006 | Wills et al. |
| 7,069,903 B2 | 7/2006 | Surnilla et al. |
| 7,082,753 B2 | 8/2006 | Dalla Betta et al. |
| 7,085,615 B2 | 8/2006 | Persson et al. |
| 7,106,866 B2 | 9/2006 | Astorino et al. |
| 7,107,978 B2 | 9/2006 | Itoyama |
| 7,111,450 B2 | 9/2006 | Surnilla |
| 7,111,455 B2 | 9/2006 | Okugawa et al. |
| 7,113,835 B2 | 9/2006 | Boyden et al. |
| 7,117,046 B2 | 10/2006 | Boyden et al. |
| 7,124,013 B2 | 10/2006 | Yasui |
| 7,149,590 B2 | 12/2006 | Martin et al. |
| 7,151,976 B2 | 12/2006 | Lin |
| 7,152,023 B2 | 12/2006 | Das |
| 7,155,334 B1 | 12/2006 | Stewart et al. |
| 7,165,393 B2 | 1/2007 | Betta et al. |
| 7,165,399 B2 | 1/2007 | Stewart |
| 7,168,239 B2 | 1/2007 | Ingram et al. |
| 7,182,075 B2 | 2/2007 | Shahed et al. |
| 7,184,845 B2 | 2/2007 | Sayyarrodsari et al. |
| 7,184,992 B1 | 2/2007 | Polyak et al. |
| 7,188,637 B2 | 3/2007 | Dreyer et al. |
| 7,194,987 B2 | 3/2007 | Mogi |
| 7,197,485 B2 | 3/2007 | Fuller |
| 7,200,988 B2 | 4/2007 | Yamashita |
| 7,204,079 B2 | 4/2007 | Audoin |
| 7,212,908 B2 | 5/2007 | Li et al. |
| 7,275,374 B2 | 10/2007 | Stewart et al. |
| 7,275,415 B2 | 10/2007 | Rhodes et al. |
| 7,281,368 B2 | 10/2007 | Miyake et al. |
| 7,292,926 B2 | 11/2007 | Schmidt et al. |
| 7,302,937 B2 | 12/2007 | Ma et al. |
| 7,321,834 B2 | 1/2008 | Chu et al. |
| 7,323,036 B2 | 1/2008 | Boyden et al. |
| 7,328,577 B2 | 2/2008 | Stewart et al. |
| 7,337,022 B2 | 2/2008 | Wojsznis et al. |
| 7,349,776 B2 | 3/2008 | Spillane et al. |
| 7,357,125 B2 | 4/2008 | Kolavennu |
| 7,375,374 B2 | 5/2008 | Chen et al. |
| 7,376,471 B2 | 5/2008 | Das et al. |
| 7,383,118 B2 | 5/2008 | Imai et al. |
| 7,380,547 B1 | 6/2008 | Ruiz |
| 7,389,773 B2 | 6/2008 | Stewart et al. |
| 7,392,129 B2 | 6/2008 | Hill et al. |
| 7,398,149 B2 | 7/2008 | Ueno et al. |
| 7,400,967 B2 | 7/2008 | Ueno et al. |
| 7,413,583 B2 | 8/2008 | Langer et al. |
| 7,415,389 B2 | 8/2008 | Stewart et al. |
| 7,418,372 B2 | 8/2008 | Nishira et al. |
| 7,430,854 B2 | 10/2008 | Yasui et al. |
| 7,433,743 B2 | 10/2008 | Pistikopoulos et al. |
| 7,444,191 B2 | 10/2008 | Caldwell et al. |
| 7,444,193 B2 | 10/2008 | Cutler |
| 7,447,554 B2 | 11/2008 | Cutler |
| 7,467,614 B2 | 12/2008 | Stewart et al. |
| 7,469,177 B2 | 12/2008 | Samad et al. |
| 7,474,953 B2 | 1/2009 | Hulser et al. |
| 7,493,236 B1 | 2/2009 | Mock et al. |
| 7,515,975 B2 | 4/2009 | Stewart |
| 7,522,963 B2 | 4/2009 | Boyden et al. |
| 7,536,232 B2 | 5/2009 | Boyden et al. |
| 7,542,842 B2 | 6/2009 | Hill et al. |
| 7,577,483 B2 | 8/2009 | Fan et al. |
| 7,587,253 B2 | 9/2009 | Rawlings et al. |
| 7,591,135 B2 | 9/2009 | Stewart |
| 7,599,749 B2 | 10/2009 | Sayyarrodsari et al. |
| 7,599,750 B2 | 10/2009 | Piche |
| 7,603,226 B2 | 10/2009 | Henein |
| 7,627,843 B2 | 12/2009 | Dozorets et al. |
| 7,630,868 B2 | 12/2009 | Turner et al. |
| 7,634,323 B2 | 12/2009 | Vermillion et al. |
| 7,634,417 B2 | 12/2009 | Boyden et al. |
| 7,650,780 B2 | 1/2010 | Hall |
| 7,668,704 B2 | 2/2010 | Perchanok et al. |
| 7,676,318 B2 | 3/2010 | Allain |

(56) References Cited

U.S. PATENT DOCUMENTS

| | | |
|---|---|---|
| 7,698,004 B2 | 4/2010 | Boyden et al. |
| 7,702,519 B2 | 4/2010 | Boyden et al. |
| 7,725,199 B2 | 5/2010 | Brackney |
| 7,743,606 B2 | 6/2010 | Havlena et al. |
| 7,748,217 B2 | 7/2010 | Muller |
| 7,752,840 B2 | 7/2010 | Stewart |
| 7,765,792 B2 | 8/2010 | Rhodes et al. |
| 7,779,680 B2 | 8/2010 | Sasaki et al. |
| 7,793,489 B2 | 9/2010 | Wang et al. |
| 7,798,938 B2 | 9/2010 | Matsubara et al. |
| 7,826,909 B2 | 11/2010 | Attarwala |
| 7,831,318 B2 | 11/2010 | Bartee et al. |
| 7,840,287 B2 | 11/2010 | Wojsznis et al. |
| 7,844,351 B2 | 11/2010 | Piche |
| 7,844,352 B2 | 11/2010 | Youzis et al. |
| 7,846,299 B2 | 12/2010 | Backstrom et al. |
| 7,850,104 B2 | 12/2010 | Havlena et al. |
| 7,856,966 B2 | 12/2010 | Saitoh |
| 7,860,586 B2 | 12/2010 | Boyden et al. |
| 7,861,518 B2 | 1/2011 | Federle |
| 7,862,771 B2 | 1/2011 | Boyden et al. |
| 7,877,239 B2 | 1/2011 | Grichnik et al. |
| 7,878,178 B2 | 2/2011 | Stewart et al. |
| 7,904,280 B2 | 3/2011 | Wood |
| 7,905,103 B2 | 3/2011 | Larsen et al. |
| 7,907,769 B2 | 3/2011 | Sammak et al. |
| 7,930,044 B2 | 4/2011 | Attarwala |
| 7,933,849 B2 | 4/2011 | Bartee et al. |
| 7,958,730 B2 | 6/2011 | Stewart |
| 7,987,145 B2 | 7/2011 | Baramov |
| 7,996,140 B2 | 8/2011 | Stewart et al. |
| 8,001,767 B2 | 8/2011 | Kakuya et al. |
| 8,019,911 B2 | 9/2011 | Dressler et al. |
| 8,025,167 B2 | 9/2011 | Schneider et al. |
| 8,032,235 B2 | 10/2011 | Sayyar-Rodsari |
| 8,046,089 B2 | 10/2011 | Renfro et al. |
| 8,060,290 B2 | 11/2011 | Stewart et al. |
| 8,078,291 B2 | 12/2011 | Pekar et al. |
| 8,109,255 B2 | 2/2012 | Stewart et al. |
| 8,121,818 B2 | 2/2012 | Gorinevsky |
| 8,145,329 B2 | 3/2012 | Pekar et al. |
| 8,209,963 B2 | 7/2012 | Kesse et al. |
| 8,229,163 B2 | 7/2012 | Coleman et al. |
| 8,265,854 B2 | 9/2012 | Stewart et al. |
| 8,281,572 B2 | 10/2012 | Chi et al. |
| 8,311,653 B2 | 11/2012 | Zhan et al. |
| 8,312,860 B2 | 11/2012 | Yun et al. |
| 8,360,040 B2 | 1/2013 | Stewart et al. |
| 8,379,267 B2 | 2/2013 | Mestha et al. |
| 8,396,644 B2 | 3/2013 | Kabashima et al. |
| 8,453,431 B2 | 6/2013 | Wang et al. |
| 8,473,079 B2 | 6/2013 | Havlena |
| 8,478,506 B2 | 7/2013 | Grichnik et al. |
| RE44,452 E | 8/2013 | Stewart et al. |
| 8,504,175 B2 | 8/2013 | Pekar et al. |
| 8,505,278 B2 | 8/2013 | Farrell et al. |
| 8,555,613 B2 | 10/2013 | Wang et al. |
| 8,596,045 B2 | 12/2013 | Tuomivaara et al. |
| 8,620,461 B2 | 12/2013 | Kihas |
| 8,649,884 B2 | 2/2014 | MacArthur et al. |
| 8,649,961 B2 | 2/2014 | Hawkins et al. |
| 8,694,197 B2 | 4/2014 | Rajagopalan et al. |
| 8,700,291 B2 | 4/2014 | Hermann |
| 8,762,026 B2 | 6/2014 | Wolfe et al. |
| 8,763,377 B2 | 7/2014 | Yacoub |
| 8,813,690 B2 | 8/2014 | Kumar et al. |
| 8,892,221 B2 | 11/2014 | Kram et al. |
| 8,899,018 B2 | 12/2014 | Frazier et al. |
| 8,904,760 B2 | 12/2014 | Mital |
| 9,170,573 B2 | 10/2015 | Kihas |
| 9,223,301 B2 | 12/2015 | Stewart et al. |
| 2002/0112469 A1 | 8/2002 | Kanazawa et al. |
| 2002/0116104 A1 | 8/2002 | Kawashima et al. |
| 2003/0089102 A1 | 5/2003 | Colignon et al. |
| 2003/0150961 A1 | 8/2003 | Boelitz et al. |
| 2004/0006973 A1 | 1/2004 | Makki et al. |
| 2004/0034460 A1 | 2/2004 | Folkerts et al. |
| 2004/0086185 A1 | 5/2004 | Sun |
| 2004/0117766 A1 | 6/2004 | Mehta et al. |
| 2004/0118107 A1 | 6/2004 | Ament |
| 2004/0144082 A1 | 7/2004 | Mianzo et al. |
| 2004/0165781 A1 | 8/2004 | Sun |
| 2004/0199481 A1 | 10/2004 | Hartman et al. |
| 2004/0221889 A1 | 11/2004 | Dreyer et al. |
| 2004/0226287 A1 | 11/2004 | Edgar et al. |
| 2005/0209714 A1 | 2/2005 | Rawlings et al. |
| 2005/0107895 A1 | 5/2005 | Pistikopoulos et al. |
| 2005/0143952 A1 | 6/2005 | Tomoyasu et al. |
| 2005/0171667 A1 | 8/2005 | Morita |
| 2005/0187643 A1 | 8/2005 | Sayyar-Rodsari et al. |
| 2005/0193739 A1 | 9/2005 | Brunell et al. |
| 2005/0210868 A1 | 9/2005 | Funabashi |
| 2006/0047607 A1 | 3/2006 | Boyden et al. |
| 2006/0111881 A1 | 5/2006 | Jackson |
| 2006/0168945 A1 | 8/2006 | Samad et al. |
| 2006/0265203 A1 | 11/2006 | Jenny et al. |
| 2006/0282178 A1 | 12/2006 | Das et al. |
| 2007/0101977 A1 | 5/2007 | Stewart |
| 2007/0142936 A1 | 6/2007 | Denison et al. |
| 2007/0144149 A1 | 6/2007 | Kolavennu et al. |
| 2007/0156259 A1 | 7/2007 | Baramov et al. |
| 2007/0275471 A1 | 11/2007 | Coward |
| 2008/0010973 A1 | 1/2008 | Gimbres |
| 2008/0071395 A1 | 3/2008 | Pachner |
| 2008/0097625 A1 | 4/2008 | Vouzis et al. |
| 2008/0103747 A1 | 5/2008 | Macharia et al. |
| 2008/0103748 A1 | 5/2008 | Axelrud et al. |
| 2008/0104003 A1 | 5/2008 | Macharia et al. |
| 2008/0109100 A1 | 5/2008 | Macharia et al. |
| 2008/0125875 A1 | 5/2008 | Stewart et al. |
| 2008/0132178 A1 | 6/2008 | Chatterjee et al. |
| 2008/0183311 A1 | 7/2008 | MacArthur et al. |
| 2008/0208778 A1 | 8/2008 | Sayyar-Rodsari et al. |
| 2008/0244449 A1 | 10/2008 | Morrison et al. |
| 2008/0264036 A1 | 10/2008 | Bellovary |
| 2009/0005889 A1 | 1/2009 | Sayyar-Rodsari |
| 2009/0008351 A1 | 1/2009 | Schneider et al. |
| 2009/0043546 A1 | 2/2009 | Srinivasan et al. |
| 2009/0087029 A1 | 4/2009 | Coleman et al. |
| 2009/0131216 A1 | 5/2009 | Matsubara et al. |
| 2009/0182518 A1 | 7/2009 | Chu et al. |
| 2009/0198350 A1 | 8/2009 | Thiele |
| 2009/0204233 A1 | 8/2009 | Zhan et al. |
| 2009/0240480 A1 | 9/2009 | Baramov |
| 2009/0254202 A1 | 10/2009 | Pekar et al. |
| 2009/0287320 A1 | 11/2009 | MacGregor et al. |
| 2009/0312998 A1 | 12/2009 | Berckmans et al. |
| 2010/0017094 A1 | 1/2010 | Stewart et al. |
| 2010/0038158 A1 | 2/2010 | Whitney et al. |
| 2010/0050607 A1 | 3/2010 | He et al. |
| 2010/0122523 A1 | 5/2010 | Vosz |
| 2010/0126481 A1 | 5/2010 | Will et al. |
| 2010/0204808 A1 | 8/2010 | Thiele |
| 2010/0268353 A1 | 10/2010 | Crisalle et al. |
| 2010/0300069 A1 | 12/2010 | Hermann et al. |
| 2010/0300070 A1 | 12/2010 | He et al. |
| 2010/0305719 A1 | 12/2010 | Pekar et al. |
| 2010/0327090 A1 | 12/2010 | Havlena et al. |
| 2011/0006025 A1 | 1/2011 | Schneider et al. |
| 2011/0010073 A1 | 1/2011 | Stewart et al. |
| 2011/0029235 A1 | 2/2011 | Berry |
| 2011/0046752 A1 | 2/2011 | Piche |
| 2011/0056265 A1 | 3/2011 | Yacoub |
| 2011/0060424 A1 | 3/2011 | Havlena |
| 2011/0066308 A1 | 3/2011 | Yang et al. |
| 2011/0071653 A1 | 3/2011 | Kihas |
| 2011/0087420 A1 | 4/2011 | Stewart et al. |
| 2011/0104015 A1 | 5/2011 | Boyden et al. |
| 2011/0125293 A1 | 5/2011 | Havlena |
| 2011/0125295 A1 | 5/2011 | Bednasch et al. |
| 2011/0131017 A1 | 6/2011 | Cheng et al. |
| 2011/0167025 A1 | 7/2011 | Danai et al. |
| 2011/0257789 A1 | 10/2011 | Stewart et al. |
| 2011/0264353 A1 | 10/2011 | Atkinson et al. |

(56) References Cited

U.S. PATENT DOCUMENTS

| | | |
|---|---|---|
| 2011/0270505 A1 | 11/2011 | Chaturvedi et al. |
| 2011/0301723 A1 | 12/2011 | Pekar et al. |
| 2012/0024089 A1 | 2/2012 | Couey et al. |
| 2012/0109620 A1 | 5/2012 | Gaikwad et al. |
| 2013/0030554 A1 | 1/2013 | Macarthur et al. |
| 2013/0067894 A1 | 3/2013 | Stewart et al. |
| 2013/0111878 A1 | 5/2013 | Pachner et al. |
| 2013/0111905 A1 | 5/2013 | Pekar et al. |
| 2013/0131956 A1 | 5/2013 | Thibault et al. |
| 2013/0131967 A1 | 5/2013 | Yu et al. |
| 2013/0204403 A1 | 8/2013 | Zheng et al. |
| 2013/0338900 A1 | 12/2013 | Ardanese et al. |
| 2014/0032189 A1 | 1/2014 | Hehle et al. |
| 2014/0174413 A1* | 6/2014 | Huang .................. F02B 47/08 123/568.18 |
| 2014/0318216 A1 | 10/2014 | Singh |
| 2014/0343713 A1 | 11/2014 | Ziegler et al. |
| 2014/0358254 A1 | 12/2014 | Chu et al. |
| 2015/0275794 A1* | 10/2015 | Verdejo ................ F02D 41/04 701/108 |
| 2015/0354877 A1 | 12/2015 | Burns et al. |
| 2016/0131089 A1* | 5/2016 | Lahti ................. F02D 41/0007 60/605.2 |

FOREIGN PATENT DOCUMENTS

| | | |
|---|---|---|
| DE | 19628796 | 10/1997 |
| DE | 10219832 | 11/2002 |
| DE | 102009016509 | 10/2010 |
| DE | 102011103346 A1 | 8/2012 |
| EP | 0301527 | 2/1989 |
| EP | 0950803 | 4/1999 |
| EP | 0877309 | 6/2000 |
| EP | 1134368 | 3/2001 |
| EP | 1180583 | 2/2002 |
| EP | 1221544 | 7/2002 |
| EP | 1225490 | 7/2002 |
| EP | 1245811 | 10/2002 |
| EP | 1273337 | 1/2003 |
| EP | 1425642 | 11/2005 |
| EP | 1686251 | 8/2006 |
| EP | 1399784 | 10/2007 |
| EP | 2107439 | 10/2009 |
| EP | 2146258 | 1/2010 |
| EP | 1794339 | 7/2011 |
| EP | 1529941 | 11/2011 |
| EP | 2551480 A1 | 1/2013 |
| EP | 2617975 | 7/2013 |
| EP | 2267559 | 1/2014 |
| EP | 2919079 | 9/2015 |
| JP | 59190443 | 10/1984 |
| JP | 2010282618 | 12/2010 |
| WO | 0144629 A2 | 6/2001 |
| WO | WO 02/32552 | 4/2002 |
| WO | WO 02/097540 | 12/2002 |
| WO | WO 02/101208 | 12/2002 |
| WO | WO 03/023538 | 3/2003 |
| WO | WO 2003/048533 | 6/2003 |
| WO | WO 03/065135 | 8/2003 |
| WO | WO 03/078816 | 9/2003 |
| WO | WO 2004/027230 | 4/2004 |
| WO | WO 2006/021437 | 3/2006 |
| WO | WO 2007/078907 | 7/2007 |
| WO | WO 2008/033800 | 3/2008 |
| WO | WO 2008/115911 | 9/2008 |
| WO | WO 2012/076838 | 6/2012 |
| WO | WO 2013/119665 | 8/2013 |
| WO | WO 2014/165439 | 10/2014 |
| WO | WO 2016/053194 | 4/2016 |

OTHER PUBLICATIONS

Diehl et al., "Real-time optimization and nonlinear model predictive control of processes governed by differential-algebraic equations" (2002), Journal of Process Control, vol. 12, pp. 577-585 [retrieved from https://www.sciencedirect.com/science/article/pii/S0959152401000233].*

"Aftertreatment Modeling of RCCI Engine During Transient Operation," University of Wisconsin—Engine Research Center, 1 page, May 31, 2014.

The Extended European Search Report for EP Application No. 15155295.7-1606, dated Aug. 4, 2015.

Hahlin, "Single Cylinder ICE Exhaust Optimization," Master's Theis, retrieved from https://pure.ltu.se/portal/files/44015424/LTU-EX-2013-43970821.pdf, 50 pages, Feb. 1, 2014.

Ricardo Software, "Powertrain Design at Your Fingertips," retrieved from http://www.ricardo.com/PageFiles/864/WaveFlyerA4_4PP.pdf, 2 pages, downloaded Jul. 27, 2015.

"Model Predictive Control Toolbox Release Notes," The Mathworks, 24 pages, Oct. 2008.

"Model Predictive Control," Wikipedia, pp. 1-5, Jan. 22, 2009. http://en.wikipedia.org/w/index.php?title=Special:Book&bookcmd=download&collecton_id=641cd1b5da77cc22&writer=rl&return_to=Model predictive control, retrieved Nov. 20, 2012.

"MPC Implementation Methods for the Optimization of the Response of Control Valves to Reduce Variability," Advanced Application Note 002, Rev. A, 10 pages, 2007.

"SCR, 400-csi Coated Catalyst," Leading NOx Control Technologies Status Summary, 1 page prior to Feb. 2, 2005.

Advanced Petroleum-Based Fuels—Diesel Emissions Control (APBF-DEC) Project, "Quarterly Update," No. 7, 6 pages, Fall 2002.

Allanson, et al., "Optimizing the Low Temperature Performance and Regeneration Efficiency of the Continuously Regenerating Diesel Particulate Filter System," SAE Paper No. 2002-01-0428, 8 pages, Mar. 2002.

Amstuz, et al., "EGO Sensor Based Robust Output Control of EGR in Diesel Engines," IEEE TCST, vol. 3, No. 1, 12 pages, Mar. 1995.

Axehill et al., "A Dual Gradiant Projection Quadratic Programming Algorithm Tailored for Model Predictive Control," Proceedings of the 47th IEEE Conference on Decision and Control, Cancun Mexico, pp. 3057-3064, Dec. 9-11, 2008.

Axehill et al., "A Dual Gradient Projection Quadratic Programming Algorithm Tailored for Mixed Integer Predictive Control," Technical Report from Linkopings Universitet, Report No. Li-Th-ISY-R-2833, 58 pages, Jan. 31, 2008.

Baffi et al., "Non-Linear Model Based Predictive Control Through Dynamic Non-Linear Partial Least Squares," Trans IChemE, vol. 80, Part A, pp. 75-86, Jan. 2002.

Bemporad et al., "Model Predictive Control Toolbox 3, User's Guide," Matlab Mathworks, 282 pages, 2008.

Bemporad et al., "The Explicit Linear Quadratic Regulator for Constrained Systems," Automatica, 38, pp. 3-20, 2002.

Bemporad, "Model Predictive Control Based on Linear Programming— The Explicit Solution," IEEE Transactions on Automatic Control, vol. 47, No. 12, pp. 1974-1984, Dec. 2002.

Bemporad, "Model Predictive Control Design: New Trends and Tools," Proceedings of the 45$^{th}$ IEEE Conference on Decision & Control, pp. 6678-6683, Dec. 13-15, 2006.

Bemporad, et al., "Explicit Model Predictive Control," 1 page, prior to Feb. 2, 2005.

Bertsekas, "On the Goldstein-Levitin-Polyak Gradient Projection Method," IEEE Transactions on Automatic Control, vol. AC-21, No. 2, pp. 174-184, Apr. 1976.

Bertsekas, "Projected Newton Methods for Optimization Problems with Simple Constraints," SIAM J. Control and Optimization, vol. 20, No. 2, pp. 221-246, Mar. 1982.

Borrelli et al., "An MPC/Hybrid System Approach to Traction Control," IEEE Transactions on Control Systems Technology, vol. 14, No. 3, pp. 541-553, May 2006.

Borrelli, "Constrained Optimal Control of Linear and Hybrid Systems," Lecture Notes in Control and Information Sciences, vol. 290, 2003.

Borrelli, "Discrete Time Constrained Optimal Control," A Dissertation Submitted to the Swiss Federal Institute of Technology (ETH) Zurich, Diss. ETH No. 14666, 232 pages, Oct. 9, 2002.

(56) References Cited

OTHER PUBLICATIONS

Catalytica Energy Systems, "Innovative NOx Reduction Solutions for Diesel Engines," 13 pages, 3rd Quarter, 2003.
Chatterjee, et al. "Catalytic Emission Control for Heavy Duty Diesel Engines," JM, 46 pages, prior to Feb. 2, 2005.
European Search Report for EP Application No. 12191156.4-1603 dated Feb. 9, 2015.
European Search Report for EP Application No. EP 10175270.7-2302419 dated Jan. 16, 2013.
European Search Report for EP Application No. EP 15152957.5-1807 dated Feb. 10, 2015.
Search Report for Corresponding EP Application No. 11167549.2 dated Nov. 27, 2012.
U.S. Appl. No. 15/005,406, filed Jan. 25, 2016.
U.S. Appl. No. 15/911,445, filed Jan. 29, 2016.
De Oliveira, "Constraint Handling and Stability Properties of Model Predictive Control," Carnegie Institute of Technology, Department of Chemical Engineering, Paper 197, 64 pages, Jan. 1, 1993.
De Schutter et al., "Model Predictive Control for Max-Min-Plus-Scaling Systems," Proceedings of the 2001 American Control Conference, Arlington, Va, pp. 319-324, Jun. 2001.
Delphi, Delphi Diesel NOx Trap (DNT), 3 pages, Feb. 2004.
Diehl et al., "Efficient Numerical Methods for Nonlinear MPC and Moving Horizon Estimation," Int. Workshop on Assessment and Future Directions of NMPC, 24 pages, Pavia, Italy, Sep. 5-9, 2008.
Dunbar, "Model Predictive Control: Extension to Coordinated Multi-Vehicle Formations and Real-Time Implementation," CDS Technical Report 01-016, 64 pages, Dec. 7, 2001.
GM "Advanced Diesel Technology and Emissions," powertrain technologies—engines, 2 pages, prior to Feb. 2, 2005.
Guerreiro et al., "Trajectory Tracking Nonlinear Model Predictive Control for Autonomous Surface Craft," Proceedings of the European Control Conference, Budapest, Hungary, 6 pages, Aug. 2009.
Guzzella, et al., "Control of Diesel Engines," IEEE Control Systems Magazine, pp. 53-71, Oct. 1998.
Havelena, "Componentized Architecture for Advanced Process Management," Honeywell International, 42 pages, 2004.
Hiranuma, et al., "Development of DPF System for Commercial Vehicle—Basic Characteristic and Active Regeneration Performance," SAE Paper No. 2003-01-3182, Mar. 2003.
Honeywell, "Profit Optimizer A Distributed Quadratic Program (DQP) Concepts Reference," 48 pages, prior to Feb. 2, 2005.
http://www.not2fast.wryday.com/turbo/glossary/turbo_glossary.shtml, "Not2Fast: Turbo Glossary," 22 pages, printed Oct. 1, 2004.
http://www.tai-cwv.com/sbl106.0.html, "Technical Overview—Advanced Control Solutions," 6 pages, printed Sep. 9, 2004.
Johansen et al., "Hardware Architecture Design for Explicit Model Predictive Control," Proceedings of ACC, 6 pages, 2006.
Johansen et al., "Hardware Synthesis of Explicit Model Predictive Controllers," IEEE Transactions on Control Systems Technology, vol. 15, No. 1, Jan. 2007.
Jonsson, "Fuel Optimized Predictive Following in Low Speed Conditions," Master's Thesis, 46 pages, Jun. 28, 2003.
Kelly, et al., "Reducing Soot Emissions from Diesel Engines Using One Atmosphere Uniform Glow Discharge Plasma," SAE Paper No. 2003-01-1183, Mar. 2003.
Keulen et al., "Predictive Cruise Control in Hybrid Electric Vehicles", May 2009, World Electric Journal, vol. 3, ISSN 2032-6653.
Kolmanovsky, et al., "Issues in Modeling and Control of Intake Flow in Variable Geometry Turbocharged Engines", 18th IFIP Conf. System Modeling and Optimization, pp. 436-445, Jul. 1997.
Kulhavy, et al. "Emerging Technologies for Enterprise Optimization in the Process Industries," Honeywell, 12 pages, Dec. 2000.
Locker, et al., "Diesel Particulate Filter Operational Characterization," Corning Incorporated, 10 pages, prior to Feb. 2, 2005.
Lu, "Challenging Control Problems and Engineering Technologies in Enterprise Optimization," Honeywell Hi-Spec Solutions, 30 pages, Jun. 4-6, 2001.
Maciejowski, "Predictive Control with Constraints," Prentice Hall, Pearson Education Limited, 4 pages, 2002.
Mariethoz et al., "Sensorless Explicit Model Predictive Control of the DC-DC Buck Converter with Inductor Current Limitation," IEEE Applied Power Electronics Conference and Exposition, pp. 1710-1715, 2008.
Marjanovic, "Towards a Simplified Infinite Horizon Model Predictive Controller," 6 pages, Proceedings of the $5^{th}$ Asian Control Conference, 6 pages, Jul. 20-23, 2004.
Mayne et al., "Constrained Model Predictive Control: Stability and Optimality," Automatica, vol. 36, pp. 789-814, 2000.
Mehta, "The Application of Model Predictive Control to Active Automotive Suspensions," 56 pages, May 17, 1996.
Moore, "Living with Cooled-EGR Engines," Prevention Illustrated, 3 pages, Oct. 3, 2004.
Murayama et al., "Speed Control of Vehicles with Variable Valve Lift Engine by Nonlinear MPC," ICROS-SICE International Joint Conference, pp. 4128-4133, 2009.
National Renewable Energy Laboratory (NREL), "Diesel Emissions Control—Sulfur Effects Project (DECSE) Summary of Reports," U.S. Department of Energy, 19 pages, Feb. 2002.
Ortner et al., "MPC for a Diesel Engine Air Path Using an Explicit Approach for Constraint Systems," Proceedings of the 2006 IEEE Conference on Control Applications, Munich Germany, pp. 2760-2765, Oct. 4-6, 2006.
Ortner et al., "Predictive Control of a Diesel Engine Air Path," IEEE Transactions on Control Systems Technology, vol. 15, No. 3, pp. 449-456, May 2007.
Pannocchia et al., "Combined Design of Disturbance Model and Observer for Offset-Free Model Predictive Control," IEEE Transactions on Automatic Control, vol. 52, No. 6, 6 pages, 2007.
Patrinos et al., "A Global Piecewise Smooth Newton Method for Fast Large-Scale Model Predictive Control," Tech Report TR2010-02, National Technical University of Athens, 23 pages, 2010.
Qin et al., "A Survey of Industrial Model Predictive Control Technology," Control Engineering Practice, 11, pp. 733-764, 2003.
Rajamani, "Data-based Techniques to Improve State Estimation in Model Predictive Control," Ph.D. Dissertation, 257 pages, 2007.
Rawlings, "Tutorial Overview of Model Predictive Control," IEEE Control Systems Magazine, pp. 38-52, Jun. 2000.
Salvat, et al., "Passenger Car Serial Application of a Particulate Filter System on a Common Rail Direct Injection Engine," SAE Paper No. 2000-01-0473, 14 pages, Feb. 2000.
Schauffele et al., "Automotive Software Engineering Principles, Processes, Methods, and Tools," SAE International, 10 pages, 2005.
Shamma, et al. "Approximate Set-Valued Observers for Nonlinear Systems," IEEE Transactions on Automatic Control, vol. 42, No. 5, May 1997.
Soltis, "Current Status of NOx Sensor Development," Workshop on Sensor Needs and Requirements for PEM Fuel Cell Systems and Direct-Injection Engines, 9 pages, Jan. 25-26, 2000.
Stefanopoulou, et al., "Control of Variable Geometry Turbocharged Diesel Engines for Reduced Emissions," IEEE Transactions on Control Systems Technology, vol. 8, No. 4, pp. 733-745, Jul. 2000.
Stewart et al., "A Model Predictive Control Framework for Industrial Turbodiesel Engine Control," Proceedings of the $47^{th}$ IEEE Conference on Decision and Control, 8 pages, 2008.
Stewart et al., "A Modular Model Predictive Controller for Turbodiesel Problems," First Workshop on Automotive Model Predictive Control, Schloss Muhldorf, Feldkirchen, Johannes Kepler University, Linz, 3 pages, 2009.
Storset, et al., "Air Charge Estimation for Turbocharged Diesel Engines," vol. 1 Proceedings of the American Control Conference, 8 pages, Jun. 28-30, 2000.
Takacs et al., "Newton-Raphson Based Efficient Model Predictive Control Applied on Active Vibrating Structures," Proceeding of the European Control Conference 2009, Budapest, Hungary, pp. 2845-2850, Aug. 23-26, 2009.
The MathWorks, "Model-Based Calibration Toolbox 2.1 Calibrate complex powertrain systems," 4 pages, prior to Feb. 2, 2005.
The MathWorks, "Model-Based Calibration Toolbox 2.1.2," 2 pages, prior to Feb. 2, 2005.
Theiss, "Advanced Reciprocating Engine System (ARES) Activities at the Oak Ridge National Lab (ORNL), Oak Ridge National Laboratory," U.S. Department of Energy, 13 pages, Apr. 14, 2004.

(56) References Cited

OTHER PUBLICATIONS

Tondel et al., "An Algorithm for Multi-Parametric Quadratic Programming and Explicit MPC Solutions," Automatica, 39, pp. 489-497, 2003.
Van Basshuysen et al., "Lexikon Motorentechnik," (Dictionary of Automotive Technology) published by Vieweg Verlag, Wiesbaden 039936, p. 518, 2004. (English Translation).
Van Den Boom et al., "MPC for Max-Plus-Linear Systems: Closed-Loop Behavior and Tuning," Proceedings of the 2001 American Control Conference, Arlington, Va, pp. 325-330, Jun. 2001.
Van Keulen et al., "Predictive Cruise Control in Hybrid Electric Vehicles," World Electric Vehicle Journal vol. 3, ISSN 2032-6653, pp. 1-11, 2009.
Wang et al., "Fast Model Predictive Control Using Online Optimization," Proceedings of the $17^{th}$ World Congress, the International Federation of Automatic Control, Seoul, Korea, pp. 6974-6979, Jul. 6-11, 2008.
Wang et al., "PSO-Based Model Predictive Control for Nonlinear Processes," Advances in Natural Computation, Lecture Notes in Computer Science, vol. 3611/2005, 8 pages, 2005.
Wright, "Applying New Optimization Algorithms to Model Predictive Control," 5th International Conference on Chemical Process Control, 10 pages, 1997.
Zavala et al., "The Advance-Step NMPC Controller: Optimality, Stability, and Robustness," Automatica, vol. 45, pp. 86-93, 2009.
Zeilinger et al., "Real-Time MPC—Stability Through Robust MPC Design," Joint $48^{th}$ IEEE Conference on Decision and Control and $28^{th}$ Chinese Control Conference, Shanghai, P.R. China, pp. 3980-3986, Dec. 16-18, 2009.
Zelenka, et al., "An Active Regeneration as a Key Element for Safe Particulate Trap Use," SAE Paper No. 2001-0103199, 13 pages, Feb. 2001.
Zhu, "Constrained Nonlinear Model Predictive Control for Vehicle Regulation," Dissertation, Graduate School of the Ohio State University, 125 pages, 2008.

\* cited by examiner

IDENTIFICATION APPROACH FOR INTERNAL COMBUSTION ENGINE MEAN VALUE MODELS

BACKGROUND

The present disclosure pertains to engine modeling, analysis and control.

SUMMARY

The disclosure reveals a system or approach for identifying mean value models with a set of equations and appropriate constraints which define the model validity. A model may be used to design an algorithm for an engine system, collecting sensed data, optimizing control parameters based on the models and data, and providing control of the engine system. These processed may be reiterated for updating control of the engine system.

DESCRIPTION

Figure 1:
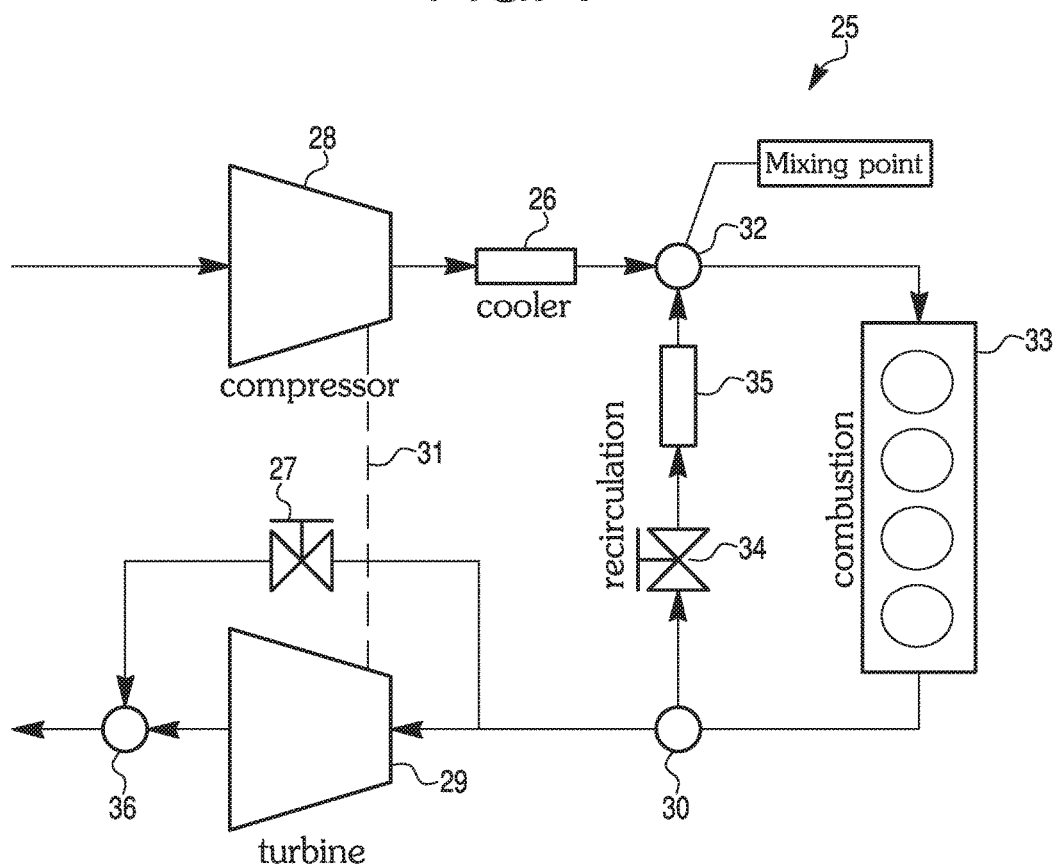
FIG. 1 is a diagram of a turbocharged diesel engine scheme.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Mean value models may be noted. The mean value model of an internal combustion engine may describe the chemical and thermodynamic processes of the substances flowing through an engine. Such models may be useful especially for optimal control of the engine in the real time, particularly the emissions control. The model may predict the effects of changes of the control parameters including an evolution of the effects in time. The model may be used to optimize the control parameters to achieve optimality both in the steady state and during transients. For such purposes, a fast and reliable model identification approach may be devised. The numerical approaches described herein may be developed to improve the identification approaches in this respect.

Mean value models may differ from the crank angle resolved models in that the engine mass flow is idealized to be independent of the crank angle. When representing an uncontrolled engine in a fixed operating point, particularly at constant speed and load with all external conditions constant, the mean value model may approximate the mass flows, pressures, and so on by equivalent constant values. The crank angle resolved models, in contrast, also respect the intake and exhaust valve opening and closing and the non-stationary mass flows through the intake and exhaust ports. At a fixed operating point, the crank angle resolved model may predict periodic flows, pressures, and so forth.

As a consequence, the mean value model may be sufficient for optimization of control parameters which do not necessarily need to be adjusted over one crank shaft revolution but rather are slowly adapted so that their values do not change significantly over one revolution. Validity of the mean value models may always be constrained to particular operating conditions. As an example, such a mean value model does not necessarily represent the engine physics if the direction of the mass flows through the model elements change. Many such constraints may be expressed as simple inequalities on model internal states, e.g., pressure at one point must be higher (lower) than pressure at other point.

A purpose of the algorithm is to perform the model identification with respect to the steady-state data in such a way that the model produces output values similar to the measured ones and, at the same time, the model signals are in the domain of its validity. This avoids a usual problem with fitting data with a meaningless model. In the approach, the model validity may be equivalent to satisfying linear inequality constraints "Ax<=b" for model internal states "x". Such states may be called feasible.

Figure 4:
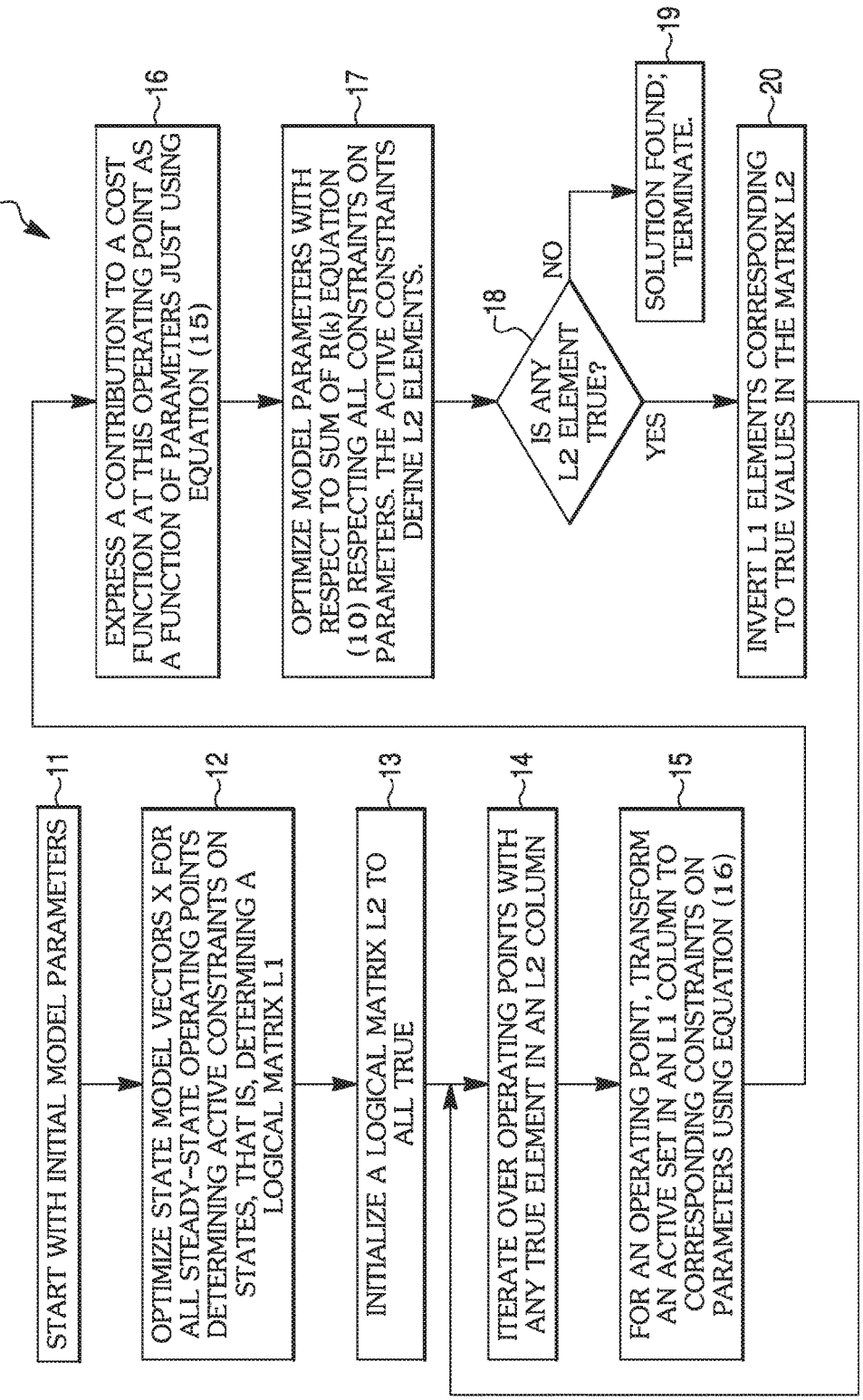
FIG. 4 is a diagram of an algorithm flowchart.

An algorithm flowchart is visualized on FIG. 4. The flowchart may use logical matrices L1 and L2 which can be represented as logical matrices with as many rows as many "x" constraints the problem has and as many columns as there are individual operating points in the data.

Value features may incorporate: 1) A true value in the logical matrix L1 may indicate the activity of the corresponding constraint in the operating point; and 2) A true value in logical matrix L2 may indicate that: the constraint activity can be toggled in the next iteration.

Logical matrices L1 and L2 may be used to organize the calculations in an efficient way. The identification process consists of 1) inner optimization, which searches for feasible vector state for given parameters, 2) outer optimization, which updates the model parameters based on information from inner optimizations at all steady-state data points. The process starts with solving inner optimizations only once to obtain initial feasible points. Then the outer optimization may be solved by iteratively implementing a process which is equivalent to the active set approach. Only the operating points which may require a change of the constraint activity are updated.

A merit of the present approach may be shown in a flowchart. Although the model states may be constrained during the optimization of model parameters, the optimization optimizes either only parameters (in outer) or only model states for fixed parameters (in inner) at the operating points separately. Thus, no high dimensional optimization problem is necessarily solved at any point. However, the low dimensional optimization may need to be solved a number of times and also the number of linear constraints may be high. For this reason, a quadratic programming approach, which may efficiently handle this situation, can be used to implement the outer optimization.

The algorithm of the diagram in FIG. 4 may solve a quadratic approximation of the cost function related to a nonlinear identification problem. The algorithm may be repeated iteratively when the approximation is updated based on the results from the previous iteration. The updating may represent an extra iteration loop which is not necessarily visualized on the diagram. In such use, the initial block "Start with Initial Model Parameters" may change to "Start with Parameters from the Previous Iteration".

The flow diagram 10 of FIG. 4 may begin at a start with initial model parameters at symbol 11. At symbol 12, a next step may be to optimize feasible state model vectors "x" for virtually all steady state operating points determining the active constraints on states, i.e., determining a logical matrix L1. The step of symbol 12 may solve inner optimization issues.

A logical matrix L2 may be initialized to all true at symbol 13. One may iterate over operating points with any true element in an L2 column at symbol 14. For an operating point, the active set in an L1 column may be transformed to corresponding constraints on parameters using equation (16) at symbol 15.

At symbol 16, a contribution to a cost function at the operating point may be expressed as a function of parameters just using equation (15). Then the model parameters may be optimized relative to a sum of R(k) of equation (10) respecting virtually all constraints on the parameters at symbol 17. The active constraints may define L2 elements. The step of symbol 17 may solve an outer optimization issue.

A question whether any L2 element is true at symbol 18 may be asked. If an answer is "no", then a solution may be regarded as found, and the procedure may be terminated at symbol 19. If the answer is "yes", then the L1 elements corresponding to true values in the L2 matrix may be inverted at symbol 20. Then the actions of symbols 14 through 18 may be repeated as an iteration loop.

There may be an additional iteration of the loop which may be repeated when an approximation is based on results from a previous iteration. Such process is known as sequential optimization. The updating the reiteration loop may begin at symbol 11 which can be restated as "Stan with Parameters from the Previous iteration", as noted herein.

FIG. 1 is a diagram of a turbocharged diesel engine scheme 25. The mean value model may be graphically represented by a scheme similar to FIG. 1 which is an approximation of the engine structure. For various engine architectures, the scheme may be slightly different and the identification algorithm will need to cover virtually all of them. The diagram may lump the dominant thermodynamic processes into idealized components which approximate the actual processes. For, example, a cooler, intercooler 26 or other coolers may be idealized components where only heat transfer between the flowing gases and their surroundings (cooling liquid) takes place. The controlled valve 27, 34, or valves, in contrast, may model the adiabatic pressure changes (i.e., occurring without gain or loss of heat) which can be controlled by Changing a valve opening. A compressor 28 and turbine 29 may be two components coupled by a common rotating shaft 31. Compressor 28 may pressurize intake air. Turbine 29 may usually have a parameter which controls the turbine's power, either through bypassing a part of the exhaust gas through a waste gate 27 to point 36 to join exhaust gas from turbine 29 for exit from the system, controlling an aspect ratio (i.e., a variable geometry turbocharger having turbine vane position control). Pressurized air may go from compressor 28 via a cooler 26 and mixing point 32 to combustion engine 33. Mixing point 32 may also receive recirculated engine exhaust gas (EGR) via valve 34 and cooler 35. Exhaust from engine 33 may go through a flow splitter 30 which splits the exhaust to turbine 29 and valve 34, but not necessarily in a 50/50 fashion.

The components in the present system or approach revealed in the diagram of FIG. 1 may be rearranged or connected in various configurations. Components may be added to or subtracted from the system or approach. The configuration of the components revealed according to the diagram of FIG. 1 is one instance or illustrative example, among others, of the present system or approach.

Figure 2:
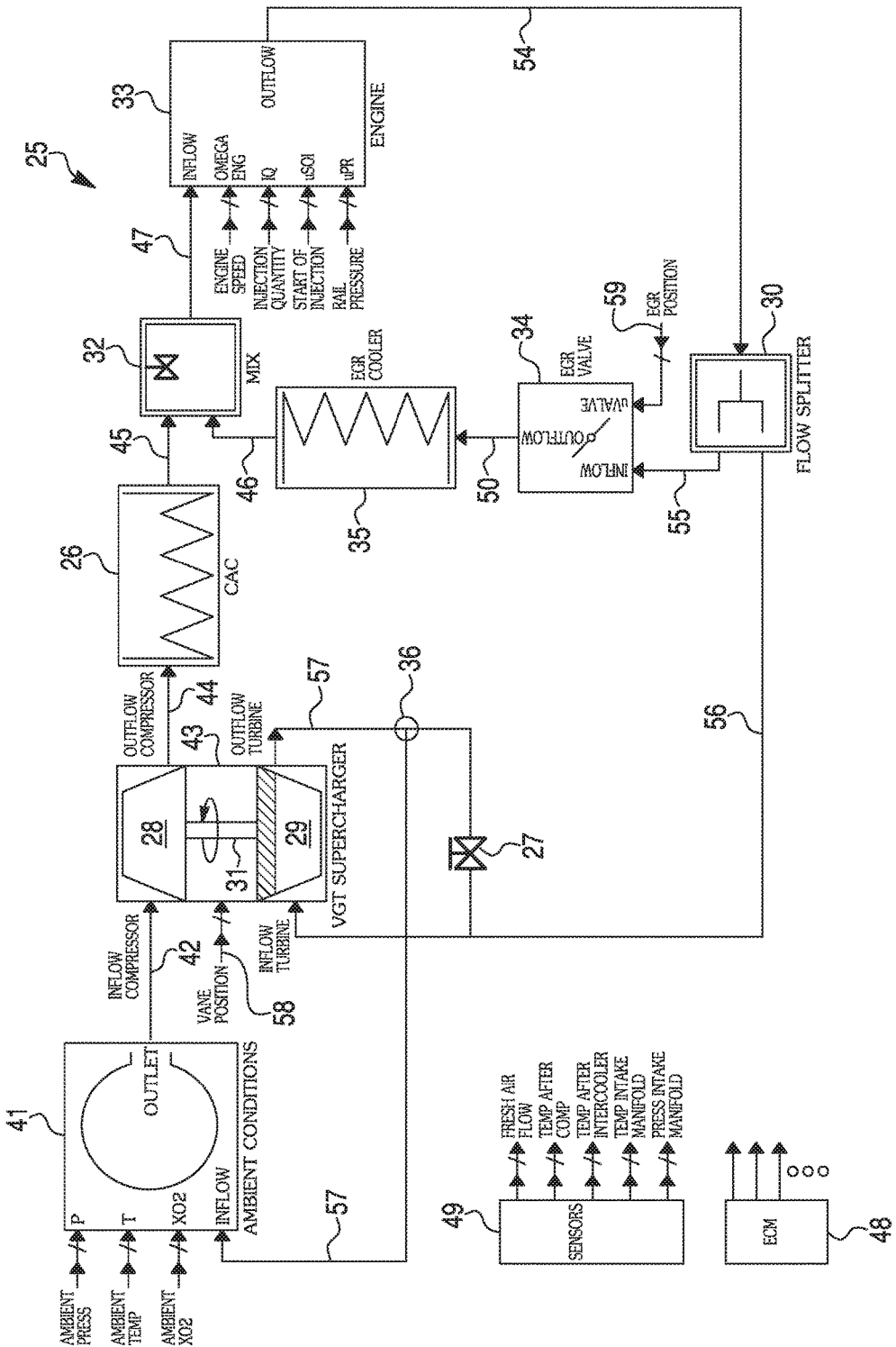
FIG. 2 is a diagram of the turbocharged diesel engine scheme revealing more information.

FIG. 2 is a diagram of turbocharged diesel engine scheme 25 with more information. Engine scheme 25 and its components may be represented by models. Air from an ambient environment 41 may be an inflow 42 to compressor 28. Ambient pressure, ambient temperature may be sensed of environment 41. Compressor 28 may be driven by turbine 29 via a connection or shaft 31 which together can constitute a turbocharger 43. An outflow 44 from compressor 28 may go to cooler or charge-air cooler 26. An output 45 from cooler 26 may go to a mixing point or valve 32. Output 45 may be mixed with some output 46 from am EGR cooler 35. An amunt of mix of output 45 with output 46 may be controlled by a signal from an engine control module 48. An output 47 from mixing point 32 may be an inflow to engine 33.

Engine control module (ECM) 48, may contain the models and inputs from sensors 49, such as fresh air flow, temperature after compressor 28, temperature after intercooler 26, temperature in the intake manifold and pressure in the intake manifold of engine 33, and so on, along with processing to determine optimal values and control signals, for instance, for engine speed, injection quantity, start of injection, rail pressure, and so on, to engine 33. An outflow 54 from engine 33 may go to flow splitter 30 that splits outflow 54 into an outflow 55 and an outflow 56. Outflow 55 may go to an EGR valve which controls an outflow 50 of exhaust through an EGR cooler 35 and output 46 to mixing valve 32. Outflow 56 may be an inflow to turbine 29 that spins compressor 28 via connection 31. An outflow 57 from turbine 29 may go to ambient environment 41. A valve or a waste gate 27 may connect inflow 56 to outflow 57 at connection 36 to permit some of inflow 56 to bypass turbine 29. A speed of the turbine 29 and compressor 28 may be controlled by valve 27 and vane position input 58. Controlling inputs to valve 27 and vane position input 58 may be provided by engine control module 48. Controlling inputs to mixing valve 32 and EGR position input 59 may also be provided by engine control module 48.

The components in the present system or approach revealed in the diagram of FIG. 2 may be rearranged or connected in various configurations. Components may be added to or subtracted from the system or approach. The configuration of the components revealed according to the diagram of FIG. 2 is one instance or illustrative example, among others, of the present system or approach.

Figure 3:
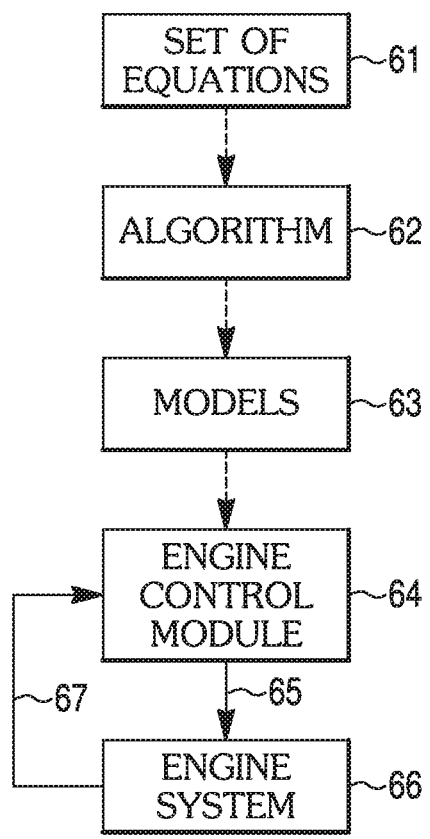
FIG. 3 is a diagram of an overall system layout.

FIG. 3 is an overall diagram of a system layout. A set of equations 61 may make up an algorithm 62. Models 63 may follow from algorithm 62. An engine control module may incorporate models for reasons of providing optimized control signals 65 to an engine system 66. Engine system may provide information and data 67 from sensors and other sources to engine control module 64 for further optimizing control signals 65.

Equations of virtually all model components may be based on first principles and contain unknown parameter values which are to be identified from the data. The model representation may be similar to the way that actual electrical devices represented by electrical circuits built from idealized physical components, such as ideal inductance, capacitance, resistance, and so forth.

An elimination approach may be noted. A model identification problem may be stated as follows. One may manipulate the model parameters to minimize the norm of differences between the values predicted by the model and the values measured on a real engine. Herein, just steady state identification may be considered. This means that the error minimization may involve only data measured on an engine which already has settled to a steady state after the last change of any exogenous signals. Particularly, the engine steady state may be described by constant control variables, pressures, temperatures, concentrations and speeds in the mean value model sense when a dependency on the crank angle is not considered.

A prediction of the model may be calculated by solving a set of differential equations which can be derived by combining all algebraic and differential equations of virtually all idealized components and respecting a model structure. The differential equations of such a model may be usually represented by a system of first order nonlinear differential equations and nonlinear output functions (nonlinear state space model) as follows.

$$\frac{d\hat{x}(t)}{dt} = f(\hat{x}(t), u(t), \theta) \quad (1)$$
$$\hat{y}(t) = g(\hat{x}(t), u(t), \theta)$$

Here, $\hat{x}$ is the vector of internal state variables; u is the vector of exogenous variables; $\hat{y}$ is the vector of model outputs and $\theta$ is the vector of model parameters. When considering the steady state, the model can be described by the following set of nonlinear equations.

$$0 = f(\hat{x}(t), u(t), \theta)$$
$$\hat{y}(t) = g(\hat{x}(t), u(t), \theta) \quad (2)$$

The identification problem may be cast as the following nonlinear least squares optimization problem, given a set of observed input and output values $\{u_k, y_k, k=1 \ldots K\}$:

$$\min_{\theta, x_k} \Sigma_{k=1}^K \|g(\hat{x}_k, u_k, \theta) - y_k\|_2^2 \quad (3)$$

This optimization may be constrained by the following equality constrain.

$$f(\hat{x}_k, u_k, \theta) = 0, \forall k \quad (4)$$

An approach to minimize (3) may seem to solve the equality constraint (4) with respect to $\hat{x}_k$ and substitute a solution $\hat{x}_k = \phi(u_k, \theta)$ to (3). This may turn the equality constrained optimization into an ordinary unconstrained optimization. In this way, the $\hat{x}_k$ variables may be eliminated and the problem is now a dimensional optimization problem.

A solution of the nonlinear equation (4) may be obtained by either solving that algebraic equation or solving the differential equation from an initial condition $x_0$ by applying constant inputs $u_k$ for a sufficiently long time. This approach may work better for stable systems as follows.

$$x_k \approx \lim_{t \to \infty} \int_0^t f(x(t), u_k, \theta) dt, \quad x(0) = x_0 \quad (5)$$

Although the $\hat{x}_k$ elimination may seem to solve the problem elegantly, there may be some possible issues in that approach.

The issues may be listed as P1, P2, P3 and P4 as in the following.

P1) A solution of the nonlinear equation (4) may be completely separated from the prediction error minimization (3). Therefore, even if many signals are measured on the engine, e.g., all state variables, $\hat{x}$ would be measured, it does not necessarily help the nonlinear equation solver to identify the correct steady state out of multiple solutions. There may be multiple solutions to the algebraic equation (4). For an approach based on the differential equation solution (5), the issue with multiple solutions does not necessarily exist when the initial condition is fixed. However, this approach may fail when the model becomes unstable in the course of identification.

P2) The nonlinear identification may work well when the initial parameter values are as close as possible to the optimal values and the initial minimized objective function value is close to the optimal value. When looking at FIG. 1 and considering the feedback structure, it may happen that the inexact initial parameter estimates will drive the model state very far from the optimal values and that the initial objective function value will be large. This may be true especially if the initial parameters push the model to the stability boundary. When sufficiently close to the boundary, the initial objective function value may be arbitrarily large. This means that the nonlinear optimization may have to execute many iterations to optimize. This will not only take time, but may also make algorithm divergence more likely.

P3) The model structure is not necessarily valid universally for any $\hat{x}$ values. When looking at FIG. 1 as an example, one may see that the compressed fresh air is mixed with the recirculated exhaust gases at the mixing point 32. This may be true as long as both compressed air and the recirculation flows have the directions indicated by the arrows. When the initial parameter values do not define the proper flow directions of either of the two, no mixing will necessarily actually happen at that point. Then, the model structure with this mixing point representing mass and energy summations in the intake will not necessarily represent the physical reality which would happen on the real engine with the same parameters. The behavior of the model may then be different from the expected behavior which is assumed to obey the laws of physics.

P4) Likewise, the model components are not necessarily valid universally for any $\hat{x}$ values. Each component model is usually valid under certain and normally satisfied conditions. As an example, the simplified compressor flow equations may often not represent the physical reality if the pressure ratio over the compressor is less than one or if the turbocharger speed is negative.

In other words, modeling engines by mean value models may use not necessarily just equations but also constraints which ensure model validity. Identification (parameter optimization) of such models may use an algorithm which respects such constraints virtually all the time, i.e., not evaluating the model equations with values outside the allowed ranges. For instance, the algorithm will not necessarily try to evaluate a compressor model with a pressure ratio below one throughout a process of optimizing its parameters.

A new formulation may be noted. An effort to solve some of the indicated difficulties may be based on making the model structure more general and more complex to behave reasonably in broader ranQes of the model signal values, which are defined by $\hat{x}$. However, the present approach may be rather based on constraining the model signals explicitly, not allowing signal values which would invalidate either the component models or the model structure. This means that the model identification problem may be cast as an inequality constraints optimization as follows.

$$\min_{\theta, x_k} \sum_{k=1}^K J_k(x_k, u_k, \theta), \quad c_i(x_k) \leq 0 \quad (6)$$

Here it may be assumed the constraints $c_i(x_k)$ are defined to preserve the validity of the model and the objective function $J_k$ penalizes the model prediction errors. Instead of considering the nonlinear equality constraint (4) explicitly, it may be proposed to turn it into a soft constraint penalizing the norm of state derivatives. Then the objective function $J_k$ may be formulated as a convex combination of the two objectives:

$$J_k(x_k,u_k,\theta)=(1-\lambda)\|g(\hat{x}(t),u_k,\theta)-y_k\|_2^2+\lambda\|f(x_k,u_k,\theta)\|_2^2 \quad (7)$$

The objective function J assumed form may be the second squared norm of the difference between measured data and model predictions:

$$J(x_k,u_k,y_k,\theta)=\|g(x_k,u_k,\theta)-y_k\|_2^2 \quad (7a)$$

Here, $x_k$ is a sequence of the model state variables, $u_k$ is sequence of model inputs, and $y_k$ is sequence of measurements, $\theta$ is the vector of model parameters. Equation (7a) may be known as the method of least squares.

In this objective function, the state variables need to be such that their derivatives are zero if substituted to the model differential equation (1). That is why one had either add this equality constraint or at least a penalty for a norm of the time derivatives, i.e., the least squares need to be formulated as equation (7b):

$$J(x_k,u_k,y_k,\theta)=(1-\lambda)\|g(x_k,u_k,\theta)-y_k\|_2^2+\lambda\|f(x_k,u_k,\theta)\|_2^2 \quad (7b)$$

Parameter $\lambda$ should control the optimization process giving relative weights to the objectives. It may be assumed that the optimal model parameters can always define proper feasible equation (7) model signals when the input signals $u_k$ are applied to the model. The inequality constraints $c_i$ may be meant to be active only in the course of an identification process, but not necessarily for the successfully identified model.

The present formulation may address the issues of the elimination approach as follows.

P1) The solution of (4) is not necessarily separated from (3) because both objectives may be optimized simultaneously. Particularly, the optimization may have a better chance to find the physically meaningful solution when there is some information about the state variables $\hat{x}_k$ in the measurements.

P2) The objective function values should not explode because the state variables $\hat{x}_k$ are not necessarily driven by the differential equation (1) in this approach. They are directly controlled by the optimization algorithm. Both P3 and P4 may be covered by the inequalities $c_i(x_k)$.

An optimization technique may be noted. An evident problem of the new formulation is that the number of optimized variables may be overwhelming. In a typical engine identification example, 500 to 1,000 steady state operating points may be measured. Considering 5 to 10 state variables $\hat{x}_k$, the number of optimized states may be 2,500 to 10,000. The number of model parameters $\theta$ appears negligible compared to these numbers (usually less than 50). Therefore, it is not necessarily easy to use the potential advantages of a new formulation, and a special identification algorithm which uses the model structure should be used. The presently new optimization approach may use a sequential quadratic programming technique to solve this large dimensional optimization problem. The technique may be based on approximating the objective function by a quadratic positive definite function and the inequality constraints by linear constraints in the following.

$$J_k(\hat{x}_k,\theta) = \frac{1}{2}\hat{x}_k' H_k^{xx} x_k + \frac{1}{2}\theta' H_k^{\theta\theta}\theta + \hat{x}_k' H_k^{x\theta}\theta + f_k'^x \hat{x}_k + f_k'^\theta \theta \quad (8)$$

$$A_k \hat{x}_k \leq b_k$$

One may propose to make use of the structure (6). The objective function may be additive, and the values of state variables valid at a particular operating point may always be present at one summand only. It may therefore be advantageous to distribute the optimization as follows.

$$\min_{\theta,x_k} \sum_{k=1}^{K} J_k(x_k,\theta) = \min_\theta \sum_{k=1}^{K} \underbrace{\min_{x_k} J_k(x_k,\theta), A_k\hat{x}_k \leq b_k}_{\text{inner}} \quad (9)$$
$$\underbrace{\phantom{aaaaaaaaaaaaaaaaaaaaaaaaaaaaaaaaaaaa}}_{\text{outer}}$$

In equation (9), the optimizations with respect to state variables $x_k$ at particular operating points may be done separately. Then, the outer minimization may minimize the overall value with respect to $\theta$. This may be done only if the inner optimizations can give the optimal values parameterized by the values of $\theta$. In other words, the inner optimization needs to provide the following functions of $\theta$ as their results as in the following.

$$R_k(\theta) \stackrel{\text{def}}{=} J_k(\arg\min_{x_k} J_k(\hat{x}_k,\theta),\theta) \quad (10)$$

Then the outer optimization may minimize the sum $\Sigma_k R_k(\theta)$ with respect to $\theta$. For the quadratic objectives (8) with linear constraints, the function $R_k$ may be quadratic with parameters which depend on the set of active constraints in the inner optimization problems. Suppose the inner iteration issue has been solved by the quadratic programming algorithm and certain inequality constraints are weakly active at the constrained optimum; that may mean that the respective Lagrange multipliers will be non-negative as follows.

$$A_k^a \hat{x}_k = b_k^a, \mu_k^a \geq 0 \quad (11)$$

One may define reduced dimension coordinates $\xi_k$ in this active set using $P_k^a$ as the matrix $A_k^a$ pseudo-inverse and the matrix $N_k^a$ as the $A_k^a$ null-space matrix as follows.

$$\hat{x}_k = P_k^a b_k^a + N_k^a \xi_k \quad (12)$$

The optimal reduced coordinates may be determined by requiring that the derivatives with respect to the reduced coordinates have to be zeros. They can be found to be affine functions of the parameters:

$$\xi_k = -(N_k'^a H_k^{xx} N_k'^a)^{-1} N_k'^a (f_k^x + H_k^{x\theta}\theta) \quad (13)$$

Figure 5:
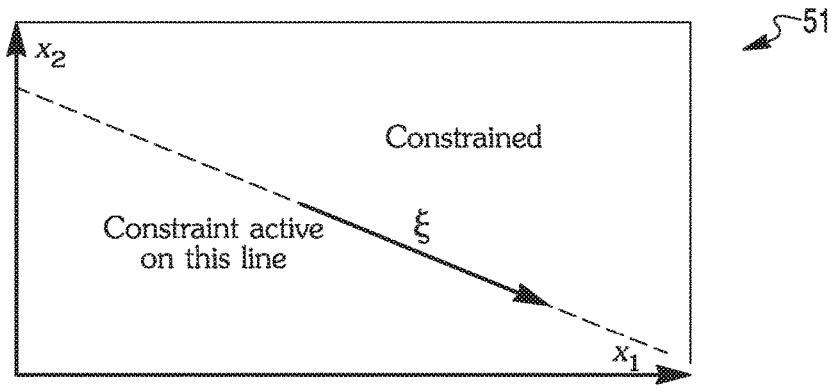
FIG. 5 is a diagram of a case having two state variables and one linear constraint active, one with a free variable.

Relative to $\xi$, if one says that certain linear constraints on the state variables are active, one in fact constrains the vector of states to certain linear subspace which borders the constrained area. The coordinates in this subspace were denoted $\xi$ in the equations (12) and (13). FIG. 5 is a diagram 51 in a case of two state variables and one linear constraint active, which may leave one with one free variable $\xi$. The free variable may define a position of the state vector 52 on the "active" line.

When substituting (13) to (12) and then to (8), the $R_k(\theta)$ may be a quadratic function of the model parameters. Therefore, the inner optimization may provide the information needed. However, the inner optimization has to also provide constraints on $\theta$ which guarantee that the active set does not necessarily change in the inner problem. These constraints may be derived as follows. The Karush-Kuhn-Tucker conditions may imply that at the optimum, the gradient of the objective function must be a certain linear combination of the gradient of the active constraints as follows.

$$\frac{\partial}{\partial \hat{x}_k} J_k(x_k, \theta) = -A_k'^a \mu_k^a, \quad \mu_k^a \geq 0 \qquad (14)$$

Together with (11), the following may be implied.

$$\begin{pmatrix} \hat{x}_k \\ -\mu_k^a \end{pmatrix} = \begin{pmatrix} H_k^{xx} & -A_k'^a \\ A_k^a & 0 \end{pmatrix}^{-1} \left( \begin{pmatrix} -f_k^x \\ b_k^a \end{pmatrix} + \begin{pmatrix} H_k^{\theta x} \\ 0 \end{pmatrix} \theta \right) \qquad (15)$$

This means that both constrained optimal $\hat{x}_k$ and the Lagrange multipliers of the weakly active constraints $\mu_k^a$ are affine functions of the model parameters $\theta$. Therefore, the necessary conditions on parameters to preserve the set of weakly active constraints at the inner optimization problem may be as follows.

$$\begin{pmatrix} A_k^i & 0 \\ 0 & I \end{pmatrix} \begin{pmatrix} H_k^{xx} & -A_k'^a \\ A_k^a & 0 \end{pmatrix}^{-1} \left( \begin{pmatrix} -f_k^x \\ b_k^a \end{pmatrix} + \begin{pmatrix} H_k^{\theta x} \\ 0 \end{pmatrix} \theta \right) \leq \begin{pmatrix} b_k^i \\ 0 \end{pmatrix} \qquad (16)$$

This may be a set of linear inequalities on the model parameters. The matrix $A_k^i$ may be formed from the following inactive inequalities $A_k^i \hat{x}_k < b_k^i$.

The optimization scheme solving the problem (9) may be described as follows. The steps denoted with "O" may pertain to the outer optimization whereas the steps denoted with "I" may pertain to the inner optimizations.

O1. The outer optimization may set an initial estimate of the model parameters $\theta$.

O2. The inner optimizations may be performed sequentially:

I1. The quadratic programming (QP1) may be used to optimize $\hat{x}_k$ to find the constrained optimum and the set of strictly active constraints, i.e., the inequalities with positive LaQrange multipliers.

I2. Equations (13) to (12) and then to may be used to evaluate $R_k$ in this active set.

I3. Equation (16) may be used to define constraints on the parameters which ensure that the previously strictly active constraints can be at least weakly active after having optimized $\theta$.

O3. The outer optimization may aggregate the $R_k$ (summing them) and the constraints on parameters (taking all of them).

O4. The outer optimization may use the quadratic programming (QP2) to find constrained optimal values of the parameters. They may be interpreted as optimal values which will not necessarily change the set of active constraints in any of the inner optimizations.

O5. The outer optimization may check the set of active constraints at QP2. If the set is empty, the parameters may be optimal. If there is an active constraint, it may indicate activity of which constraints on "x" at which steady state data points, needs to be toggled (changed from inactive to active or vice versa). This means that the active constraints may be changes at one inner optimization. This inner optimization may be recalculated with the new values of parameters. The other inner optimizations do not necessarily need to be recalculated because their $R_k$ is still valid. Then the algorithm may proceed from O4.

A conclusion may be noted. The identification of the mean value model parameters based on steady state data may be formulated as an optimization problem. It has been shown that the optimization problem may be either very high dimensional or the values of state variables at the steady state need to be eliminated. This elimination may cause the state values to be no more under control and cannot be constrained in order to preserve model validity and steady state consistence with measurements. Therefore, one may propose here not to eliminate the state variables. An approach solving the high dimensional constrained optimization problem may be proposed instead, as indicated herein. The optimization scheme may make use of the problem structure. This may be done elegantly if the objective function is quadratic and the inequality constraints are linear. Although it may be true that the objective function (6) is not necessarily quadratic, the algorithm can still be used if, for example, the objective function is successively locally approximated by quadratic functions. This may be regarded as a sequential quadratic programming technique. Another approach in how to use the algorithm may be based on piece-wise linear approximations of the model nonlinearities.

The present identification technique may be very significant for commercial model and control design tools which are used by non-experts on identification and numerical optimization. For numerous reasons, the reliability and robustness of the optimizations are critical factors for the customers' acceptance and satisfaction.

To recap, a modeling mechanism for an engine system may incorporate an engine control module (ECM) connected to an engine system, and a model representing the engine system. The engine system may incorporate an engine, actuators and sensors of the engine connected to the ECM, a turbocharger having an output connected to an input of the engine, and an aftertreatment device having an input connected to an output of the engine. The model representing the engine system may be situated in the ECM. The model representing the engine system may be a mean value model that uses equations and constraints. The constraints may ensure model validity in that equations of the model are prevented from evaluation with values outside of ranges allowed for the engine system being represented.

The model representing the engine in a steady state may incorporate one or more equations consisting of terms $\hat{x}$, $u$, $\hat{y}$ and $\theta$ representing internal state variables, exogenous variables, model outputs and model parameters, respectfully. The one or more equations may incorporate $$\theta = f(\hat{x}(t), u(t), \theta)$$

$$\hat{y}(t) = g(\hat{x}(t), u(t), \theta)$$

An identification of the model may be cast in as a least squares optimization for observed input and output values $[u_k, y_k, k=1 \ldots K]$ as $$\min_{\theta, x_k} \Sigma_{k=1}^K \| g(\hat{x}_k, u_k, \theta) - y_k \|_2^2$$

The least squares optimization may be constrained by $$f(\hat{x}_k, u_k, \theta) = 0, \forall k$$

where $\forall$ indicates that f for a sequence of k.

The ECM may receive data from the sensors of the engine system, which are processed in view of the model. The ECM may send signals, which are optimized in view of the model, to the actuators of the engine system. The ECM may provide real time control of the engine system.

An approach for an approximation of a cost function relative to nonlinear identification for a mean value model for an engine system, may incorporate selecting initial model parameters for an engine system, and optimizing state model vectors for steady state operating points determining active constraints on states, that is, determining a first logical matrix of elements. The first logical matrix may have as many rows as a number of state model vector constraints and as many columns as a number of individual operating points in data.

The approach may further incorporate initializing a second logical matrix of elements to virtually all true. The second logical matrix may have as many rows as a number of state model vector constraints and as many columns as a number of individual operating points in the data.

The approach may further incorporate iterating over steady state operating points with a true element in a column of the second logical matrix. For a steady state operating point, an active set in a column in the first logical matrix may be transformed to corresponding constraints on parameters.

The approach may further incorporate expressing a contribution to a cost function at the steady state operating point as a function of parameters only, and optimizing model parameters with respect to a sum of constraints on parameters. Active constraints may define elements of the second logical matrix.

If any element of the second logical matrix is false, then a solution may be found.

If any element of the second logical matrix is true, then elements of the first logical matrix corresponding to true values in the second logical matrix may be inverted. The approach may further incorporate repeating one or more portions of the previously mentioned approach.

A turbocharged engine model system may incorporate an engine model of an engine of an engine system; a mixing point model having an output connected to an inflow port of the engine model; a turbocharger model having an inflow turbine port connected to an outflow port of the engine model, an outflow compressor port connected to an input of the mixing point model, and having an outflow turbine port and an inflow compressor port; and a processor incorporating a plurality of the models, including the engine model, mixing point model and the turbocharger model, and being connected to the engine.

The models may be mean value models that use equations and constraints. The constraints may ensure model validity in that the equations can be prevented from evaluation with values outside allowed ranges. The processor may receive data from sensors of the engine system and, in accordance with the models and calculated equations and constraints, provide optimized signals to actuators of the engine system.

The plurality of models may further incorporate an exhaust gas recirculation valve model having an input connected to the outflow port of the engine model; and an exhaust gas recirculation cooler model having an input connected to an output of the exhaust gas recirculation valve model and an output to a second input of the nixing point model.

The plurality of models may further incorporate a charge air cooler model having an input connected to the outflow compressor port, and having an output connected to an input of the mixing point model.

The plurality of models may further incorporate a flow splitter model having an input connected to the outflow port of the engine model, a first output connected to the inflow turbine port of the turbocharger model and a second output connected to an inflow port of the exhaust gas recirculation valve model.

U.S. patent application Ser. No. 12/782,004, filed May 18, 2010, entitled "Distributed Model Identification", is hereby incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A mechanism for controlling an engine system, comprising:
an engine control module (ECM) connected to an engine system; and
a model representing the engine system; and
wherein:
the engine system comprises:
an engine;
actuators and sensors of the engine connected to the ECM;
a turbocharger having an output connected to an input of the engine; and
an aftertreatment device having an input connected to an output of the engine;
the model representing the engine system is situated in the ECM;
the model representing the engine system is a mean value model that uses equations and constraints;
the model representing the engine in a steady state comprises one or more equations consisting of terms $\hat{x}$, u, $\hat{y}$ and θ representing internal state variables, exogenous variables, model outputs and model parameters, respectfully;
the one or more equations comprise $$0 = f(\hat{x}(t), u(t), \theta)$$

$$\hat{y}(t) = g(\hat{x}(t), u(t), \theta);$$

the constraints ensure model validity in that equations of the model are prevented from evaluation with values outside of ranges allowed for the engine system being represented; and
the ECM receives data from the sensors of the engine system, which are processed in view of the model; and
the ECM sends signals, which are configured based on the model, to the actuators of the engine system.

2. The mechanism of claim 1, wherein:
an identification of the model is cast in as a least squares optimization for observed input and output values $\{u_k, y_k, k=1 \ldots K\}$ as $$\min_{\theta, x_k} \Sigma_{k=1}^{K} \|g(\hat{x}_k, u_k, \theta) - y_k\|_2^2;$$

and
the least squares optimization is constrained by $f(\hat{x}_k, u_k, \theta) = 0, \forall k$,
where $\forall$ indicates that f is for a sequence of k.

3. The mechanism of claim 1, wherein
the signals from the ECM to the actuators are optimized in view of the model.

4. The mechanism of claim 1, wherein the ECM provides real time control of the engine system.

5. A method for controlling an engine system based on an approximation of a cost function relative to nonlinear identification for a mean value model for the engine system, comprising:
selecting initial model parameters for an engine system; and
optimizing state model vectors for steady state operating points determining active constraints on states, that is, determining a first logical matrix of elements;
receiving data from sensors of the engine system, which are processed in view of the optimized state model vectors;
sending signals, which are configured based on the optimized state model vectors, to the actuators of the engine system; and
wherein the first logical matrix has as many rows as a number of state model vector constraints and as many columns as a number of individual operating points in data.

6. The method of claim 5, further comprising:
initializing a second logical matrix of elements to virtually all true; and
wherein the second logical matrix has as many rows as a number of state model vector constraints and as many columns as a number of individual operating points in the data.

7. The method of claim 6, further comprising:
iterating over steady state operating points with a true element in a column of the second logical matrix; and
wherein for a steady state operating point, an active set in a column in the first logical matrix is transformed to corresponding constraints on parameters.

8. The method of claim 5, further comprising:
expressing a contribution to a cost function at the steady state operating point as a function of parameters only; and
optimizing model parameters with respect to a sum of constraints on parameters; and
wherein active constraints define elements of the second logical matrix.

9. The method of claim 8, wherein if any element of the second logical matrix is false, then a solution is found.

10. The method of claim 8, wherein:
if any element of the second logical matrix is true, then elements of the first logical matrix corresponding to true values in the second logical matrix are inverted; and
further comprising repeating the method recited in claim 6.

11. A turbocharged engine model system comprising:
an engine model of an engine of an engine system;
a mixing point model having an output connected to an inflow port of the engine model;
a turbocharger model having an inflow turbine port connected to an outflow port of the engine model, an outflow compressor port connected to an input of the mixing point model, and having an outflow turbine port and an inflow compressor port; and
a processor incorporating a plurality of the models, including the engine model, mixing point model and the turbocharger model, and being connected to the engine; and
wherein:
the models are mean value models that use equations and constraints;
the engine model, when representing the engine in a steady state, comprises one or more equations consisting of terms $\hat{x}$, u, $\hat{y}$ and $\theta$ representing internal state variables, exogenous variables, model outputs and model parameters, respectfully;
the one or more equations comprise $0 = f(\hat{x}(t), u(t), \theta)$ $\hat{y}(t) = g(\hat{x}(t), u(t), \theta)$, the constraints ensure model validity in that the equations are prevented from evaluation with values outside allowed ranges; and
the processor receives data from sensors of the engine system and, in accordance with the models and calculated equations and constraints, provides optimized signals to actuators of the engine system.

12. The system of claim 11, wherein the plurality of models further comprises:
an exhaust gas recirculation valve model having an input connected to the outflow port of the engine model; and
an exhaust gas recirculation cooler model having an input connected to an output of the exhaust gas recirculation valve model and an output to a second input of the mixing point model.

13. The system of claim 12, wherein the plurality of models further comprises a charge air cooler model having an input connected to the outflow compressor port and an output connected to an input of the mixing point model.

14. The system of claim 13, wherein the plurality of models further comprises a flow splitter model having an input connected to the outflow port of the engine model, a first output connected to the inflow turbine port of the turbocharger model and a second output connected to an inflow port of the exhaust gas recirculation valve model.

* * * * *